United States Patent
Bell

(10) Patent No.: US 6,812,395 B2
(45) Date of Patent: Nov. 2, 2004

(54) THERMOELECTRIC HETEROSTRUCTURE ASSEMBLIES ELEMENT

(75) Inventor: Lon E. Bell, Altadena, CA (US)

(73) Assignee: BSST LLC, Irwindale, CA (US)

(*) Notice: Subject to any disclaimer, the term of this patent is extended or adjusted under 35 U.S.C. 154(b) by 99 days.

(21) Appl. No.: 09/987,232

(22) Filed: Nov. 6, 2001

(65) Prior Publication Data

US 2003/0079770 A1 May 1, 2003

Related U.S. Application Data

(60) Provisional application No. 60/331,021, filed on Oct. 24, 2001.

(51) Int. Cl.$^7$ ............................ H01L 35/34; H01L 35/28; H01L 35/30; H01L 35/08
(52) U.S. Cl. ...................... 136/201; 136/203; 136/205; 136/237
(58) Field of Search ................ 136/200, 201, 136/203, 204, 237; 62/3.2, 3.3

(56) References Cited

U.S. PATENT DOCUMENTS

| | | | |
|---|---|---|---|
| 3,006,979 A | * 10/1961 | Rich | 136/204 |
| 3,129,116 A | * 4/1964 | Corry | 136/208 |
| 3,635,037 A | 1/1972 | Hubert | 62/3 |
| 3,681,929 A | 8/1972 | Schering | 62/3 |
| 3,779,814 A | 12/1973 | Miles et al. | 136/236 |
| 4,065,936 A | 1/1978 | Fenton et al. | 62/3 |
| 4,730,459 A | 3/1988 | Schlicklin et al. | 62/3 |
| 4,731,338 A | * 3/1988 | Ralston et al. | 438/36 |
| 5,092,129 A | 3/1992 | Bayes et al. | 62/3.3 |
| 5,228,923 A | 7/1993 | Hed | 136/208 |
| 5,232,516 A | 8/1993 | Hed | 136/204 |
| 5,429,680 A | * 7/1995 | Fuschetti | 136/203 |
| 5,802,856 A | 9/1998 | Schaper et al. | 62/3.7 |
| 5,867,990 A | * 2/1999 | Ghoshal | 62/3.7 |
| 5,900,071 A | * 5/1999 | Harman | 136/236.1 |
| 6,084,172 A | 7/2000 | Kishi et al. | 136/200 |
| 6,319,744 B1 | * 11/2001 | Hoon et al. | 438/54 |
| 6,334,311 B1 | 1/2002 | Kim et al. | 62/3.2 |
| 6,346,668 B1 | 2/2002 | McGrew | 136/200 |
| 6,347,521 B1 | 2/2002 | Kadotani et al. | 62/3.7 |

OTHER PUBLICATIONS

A New Concept of Porous Thermoelectric Module Using a Reciprocating Flow for Cooling/Heating System (Numerical Analysis for Heating System). Shigeru Tada, Ryozo Echigo and Hideo Yoshida, 16$^{th}$ International Conference on Thermoelectrics (1997).
International Search Report for PCT/US 02/03654 dated Jun. 12, 2002.
H.J. Goldsmid, *Electronic Refrigeration*, Pion Ltd, 207 Brondesbury Park, London (1986).
Stanley W. Angrist, *Direct Energy Conversion*, 32 Ed. Ally & Bacon (1976).
International Search Report for PCT/US 02/06285 dated Jun. 12, 2002.
A New Concept for Improving Thermoelectric Heat Pump Efficiency, R.J. Buist, J.W. Fenton and J.S. Lee, Borg–Warner Thermoelectrics Wolf and Algonquin Road.

* cited by examiner

*Primary Examiner*—Patrick Ryan
*Assistant Examiner*—Thomas H. Parsons
(74) *Attorney, Agent, or Firm*—Knobbe Martens Olson & Bear LLP

(57) ABSTRACT

Improved thermoelectric assemblies are disclosed, wherein layers of heterostructure thermoelectric materials or thin layers of thermoelectric material form thermoelectric elements. The layers are bound together with agents that improve structural strengths, allow electrical current to pass in a preferred direction, and minimize or reduce adverse affects, such a shear stresses, that might occur to the thermoelectric properties and materials of the assembly by their inclusion.

12 Claims, 7 Drawing Sheets

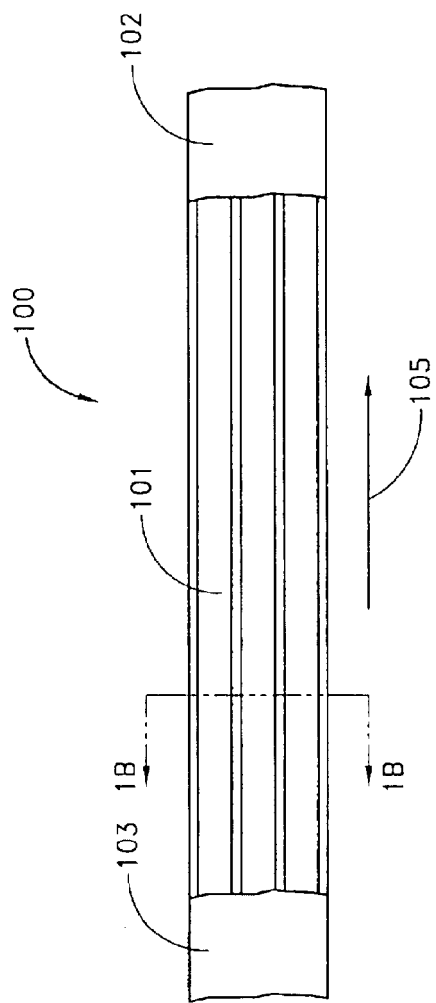
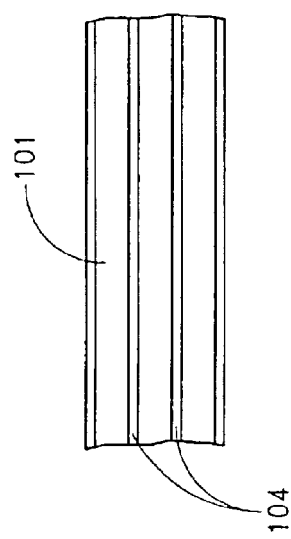

THERMOELECTRIC HETEROSTRUCTURE ASSEMBLIES ELEMENT

REFERENCE TO PRIOR RELATED PROVISIONAL APPLICATION

This application is related to and claims the benefit of the filing of U.S. Provisional Application No. 60/331,021, entitled Thermoelectric Hetrostructure Assemblies Element, filed Oct. 24, 2001.

BACKGROUND OF THE INVENTION

1. Field of the Invention

The following disclosure relates generally to thermoelectrics configured from heterostructures or thin layers of thermoelectric material to improve performance or usability of such thermoelectrics.

2. Description of the Related Art

The bulk properties of thermoelectric (TE) materials can be altered if the materials are formed from very thin films or segments of alternating materials. The resultant assemblies formed of segments of such thin films are usually called heterostructures. Each film segment is the order of tens to hundreds of angstroms thick. Since each segment is very thin, multiple segments are needed to fabricate cooling, heating and power generating devices. The shape, dimensions and other geometrical characteristics of conventional heterostructures often make attachment of suitable thermal heat transfer members and electrodes to the individual heterostructures assembly difficult. Further complications arise in the extraction of thermal power from the structures. New fabrication techniques, material combinations, and forming methods are required to fabricate TE elements from such materials. New fabrication techniques are even more critical for systems made from thousands of segments since materials formed of many segments tend to be fragile and weakened by (1) internal stresses that result from fabrication, (2) the very nature of the materials and (3) internal weakness caused by contamination and process variation. Further, certain TE materials, such as those based on Bismuth/Tellurium/Selenium mixtures, are inherently mechanically weak and hence, fragile in heterostructure form.

Heterostructure TE materials generally are configured to be long in one dimension (e.g., wires) or two dimensions (e.g., plates). The TE materials are usually anisotropic with varying thermal, electrical, and mechanical properties along different axes. Electric current either flows parallel to a long dimension or perpendicular to the long dimension(s). In TE elements where the current flows parallel to the long dimension, the length can range up to thousands of times the thickness or diameter of the material. To achieve the desired performance, such TE elements can be made of a multiplicity of heterostructure wires or plates.

SUMMARY OF THE INVENTION

Various embodiments using heterostructures in forming thermoelectric elements are disclosed. The heterostructures are constructed with layers of bonding and/or intermediate materials that add strength and/or improve manufacturability of completed thermoelectric elements formed of the heterostructures. In addition, the bonding and intermediate materials are used in various manners to facilitate or enhance the operation of thermoelectric assemblies. The thickness of the intermediate and bonding materials take into account the desired thermal and electrical characteristics and attributes for the particular configuration or application. Both the thermal conductivity and thermal conductance can be taken into account, in considering the thickness of each bonding and intermediate material.

Several configurations for thermoelectrics are described. One configuration involves a thermoelectric element that has at least two heterostructure thermoelectric portions of the same conductivity type (such as N-type or P-type). It should be noted that the use of the term "same conductivity type" in this configuration does not mean that these portions need to be of the same material, nor doping concentration. An electrically conductive material is coupled to the thermoelectric portions to form at least one electrode.

Preferably, the heterostructure thermoelectric portions form layers in the thermoelectric element, and the electrically conductive material is coupled to at least one of the layers at at least one end of the layers. Preferably, the conductive material couples to all or substantially all of the layers, where the electrode is an end electrode. Alternatively, the electrically conductive material may be coupled to at least the top or bottom of the layers.

In one configuration, the heterostructure thermoelectric portions form wires or a wire bundle, and the electrically conductive material forms at least one electrode at the end of the wire bundle. Preferably, an electrode is provided for each. Alternatively, the electrically conductive material is coupled to at least the top or bottom of the wires, or separate electrodes are provided for the top and bottom of the wires.

In one example, a bonding material is between the at least two heterostructure thermoelectric portions. The bonding material is advantageously configured to reduce the power density or the shear stress in the element, or both.

An intermediate material may also be provided between the bet heterostructure thermoelectric portions and respective electrodes. Advantageously, the intermediate material is configured to reduce shear stress in the heterostructure thermoelectric portions when the thermoelectric element is operated. For example, the intermediate material may be resilient.

In one example, the heterostructure thermoelectric portions are of substantially the same thermoelectric material. The heterostructure thermoelectric portions may also be constructed of at least two layers of heterostructure thermoelectric material.

Another example of a thermoelectric element described has at least two layers of substantially the same thermoelectric material of the same conductivity type. At least one electrically conductive material is coupled to the thermoelectric material to form at least one electrode. In one form, the electrically conductive material is coupled to the layers at at least one end of the layers. Preferably, an electrode is provided at at least two ends. Alternatively, the electrically conductive material is coupled to at least the top or bottom of the layers, forming top and bottom electrodes. The layers may also form wires, with the electrodes coupled to the wires at at least one end of the wires, or coupled to at least the top or bottom of the wires.

In this example, a bonding material may also be provided between the at least two layers. Advantageously, the layers and the bonding material are configured to reduce the power density of the thermoelectric. The layers and the bonding material may be configured to reduce shear stress as an alternative, or in addition to, reducing the power density.

An intermediate material may also be provided between at least one electrode and at least one layer of the thermoelectric material. Preferably, the intermediate material is also configured to reduce shear stress in the layers. In one configuration, the intermediate material is resilient.

The at least two layers may also be heterostructures, as with the previous example. The heterostructures themselves may be made from at least two layers of heterostructure thermoelectric material.

Also disclosed is a method of producing a thermoelectric device involving the steps of layering at least two heterostructure thermoelectric segments, and connecting at least one electrode to the segments to form at least one thermoelectric element.

The step of layering may comprise bonding the at least two heterostructure thermoelectric segments with a bonding material. A further step of providing an intermediate material between at least one of the at least two heterostructure thermoelectric segments and at least one electrode may be used.

Preferably, the layers and/or the bonding and/or intermediate materials are configured to decrease power density. One or another, or all, may be configured to reduce shear stress as well, and/or reducing the power density.

Another method of producing a thermoelectric device involves the steps of forming at least two layers of substantially the same thermoelectric material, and connecting at least one electrode to at least one of the layers. Preferably, the step of forming involves bonding the at least two layers with a bonding material.

Advantageously, as mentioned above, the bonding material is configured to decrease power density and/or shear stresses. Similarly, an intermediate layer may be provided between the layers and the electrodes.

BRIEF DESCRIPTION OF THE DRAWINGS

FIG. 1 illustrates a thermoelectric element constructed of thermoelectric heterostructures.

DETAILED DESCRIPTION OF THE PREFERRED EMBODIMENT

Figures 2A, 2B:
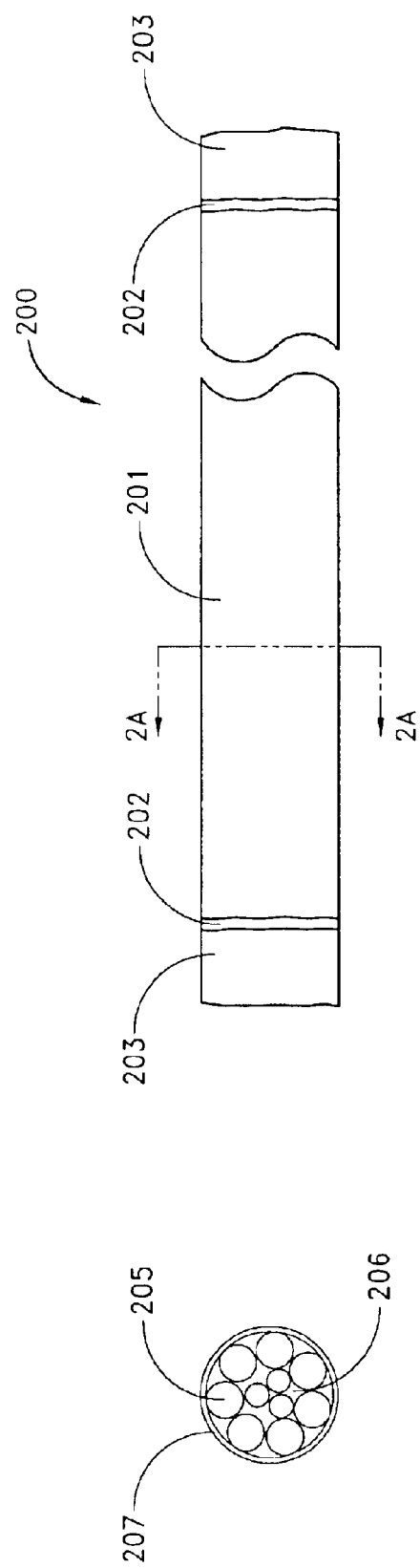
FIG. 2 illustrates a thermoelectric wire bundle assembly.

Several embodiments of thermoelectrics are disclosed where layers of heterostructure thermoelectric materials or thin layers of thermoelectric material form a thermoelectric element. Advantageously, the layers are of the same conductivity type (N-type or P-type) for each thermoelectric element. In one embodiment, the layers are of the same, or at least substantially the same, thermoelectric material. Where the layers are heterostructures, the heterostructures themselves may be formed of layers, of thermoelectric material. The layers may be bound together with agents that improve structural strength, allow electrical current to pass in a preferred direction, and minimize adverse effects that might occur to the thermoelectric properties of the assembly by their inclusion. Fabrication of useful TE systems requires a careful understanding of the TE materials' individual properties, such as thermal conductivity, electrical conductivity, coefficient of thermal expansion, properties over the processing and operating temperature ranges, and long-term stability. Often properties associated with other materials used in assembly of TE elements also can affect performance. Often interfacial diffusivity, work function, bond strength and the like are characteristics that arise from the use of combinations of materials and can affect performance.

In systems where the preferred direction of current flow is parallel to a long dimension (e.g., along a bundle of wires or along the long direction of plates), a bonding material for the heterostructures or thermoelectric layers advantageously has low thermal and electrical conductivity, high adhesive strength, and stable general properties that do not change during use.

For systems where the current flows perpendicular to the long dimensions, such as through heterostructures or thermoelectric material layers forming plates, preferred binding agents have high electrical conductivity so that electric current passes through the material with little resistive loss. Preferably, this is achieved by the binding agent wetting the TE materials' surfaces either directly, or through the use of an intermediate compatible wetting agent. Advantageous bindings agents also do not degrade the performance of the resultant system either by requiring high fabrication temperatures that could cause diffusion in the TE heterostructure or promote degradation with time through diffusion, ionic exchange, corrosion or other mechanisms. FIG. 1 depicts a TE 100 constructed of TE heterostructure plates 101 terminated at each end with electrodes 102, 103. The layered plates 101 are assembled with a bonding material 104. The TE 100 may make up one leg or element of a TE module, and is either N or P conductivity type TE material. Generally, many such TE elements are arrayed so that current 105 flows alternately between N and P type materials, with electrodes 102 and 103 making part or all of the current flow path between TE elements 100.

At a first interface between the electrode 102 and the TE plates 101, thermal energy, for example, is removed and at the second interface between other electrode 103 and the TE plates 101 in this example, thermal energy is absorbed. Thus, electrode 102 is cooled and electrode 103 is heated. In normal heating or cooling operation, the heated electrode 103 is hotter than the cooled electrode 102 so that heat flows from electrode 103 to electrode 102. In power generation operation, a temperature gradient applied across the electrodes causes current to flow. Advantageously, the properties of the TE plates 101 and bonding material 104, the current 105 and the overall dimensions are chosen to minimize the combination of the resultant conductive heat loss and Joule heating from the current 105 passing through the TE element 100 so as to maximize cooling or thermoelectric efficiency, or power generation as is known in the art.

The bonding material 104 attaches the thin TE plates 101 into a slab that can be further processed (i.e., to connect electrodes 102 and 103 with greater ease). Note, however, the bonding material 104 conducts heat and thereby degrades the overall performance of the TE element 100. Advantageously, therefore the bonding material 104 should have poor thermal conductivity. It could be an unfilled epoxy and should be in as low a proportion as possible to the TE plates 101. Further it should not degrade with time, and should not reduce in other ways the TE system's thermal performance. Similarly, the bonding material 104 should not conduct electrical current to the extent that such conductance measurably increases Joule heating or causes current to bypass the TE plates 101. However, it is noted that some degree of electrical conductivity in the bonding material 104 can be of benefit in assemblies as noted below in connection with the description of FIG. 7.

FIG. 2 depicts a TE element 200 in which the end electrodes 203 and TE wires 205 or wire bundle are in contact with an intermediate conductor 202. The wire assembly 201 has a bonding material 206 and a sheath 207 around the wire bundle 205.

The considerations that relate to efficiency and performance of this configuration are the same as those for the TE element 100 of FIG. 1. Thus, advantageously, the bonding material 206 should have low thermal conductivity and either be an electrical insulator or be of low electrical conductivity. Preferably, the sheath 207 should have very low thermal and electrical conductivity.

The intermediate conductor material 202 serves to assure uniform, very low electrical and thermal resistance between the TE wires 205 and the electrodes 203. Advantageously, it makes uniform electrical and mechanical connections to every wire. In some configurations, where electrically conductive bonding material 206 is appropriate, the intermediate material 202 makes electrical contact with the bonding material 206 as well. The intermediate material 202 can be applied by vapor deposition, sputtering, plating or any other process that forms a suitable electrical and mechanical connection. In addition, the intermediate material 202 can be a solder that wets the wire 205 ends, can be conductive adhesive, can be a flexible or otherwise resilient material that is maintained under compressive force to provide electrical continuity or any other suitable electrical connection mechanism. Further, the intermediate material 202 can itself be made of more than one material. For example, a first layer could be nickel sputtered onto the wires at their ends, and a second layer of tin plating for solderability. A copper electrode 203 could have a copper flash and gold plating for solderability. Finally these two assemblies could be bonded together with solder to form the complete terminator of the assembly 200.

Similarly, the sheath 207 could be multi-layered. For example, it could consist of an inner conformal coating covered by a solid or mesh outer layer. It could serve any of several mechanical purposes, such as providing the mechanical attachment to maintain compressive forces on electrodes 202 as described above. Alternately, the sheath 207 could be omitted altogether as in the design in FIG. 1.

The bonding material 206 could be omitted as well, or it could only partially fill the voids so as to have air or vacuum spaced within the assembly. It could be a coating applied to the outer surface of the wires 205 and then sintered or pressed, so as to electrically connect and/or mechanically hold the wires 205 in the desired final configuration.

Finally, the electrodes 203 could be placed on the top and/or bottom of the wires rather than forming end electrodes.

Figure 3:
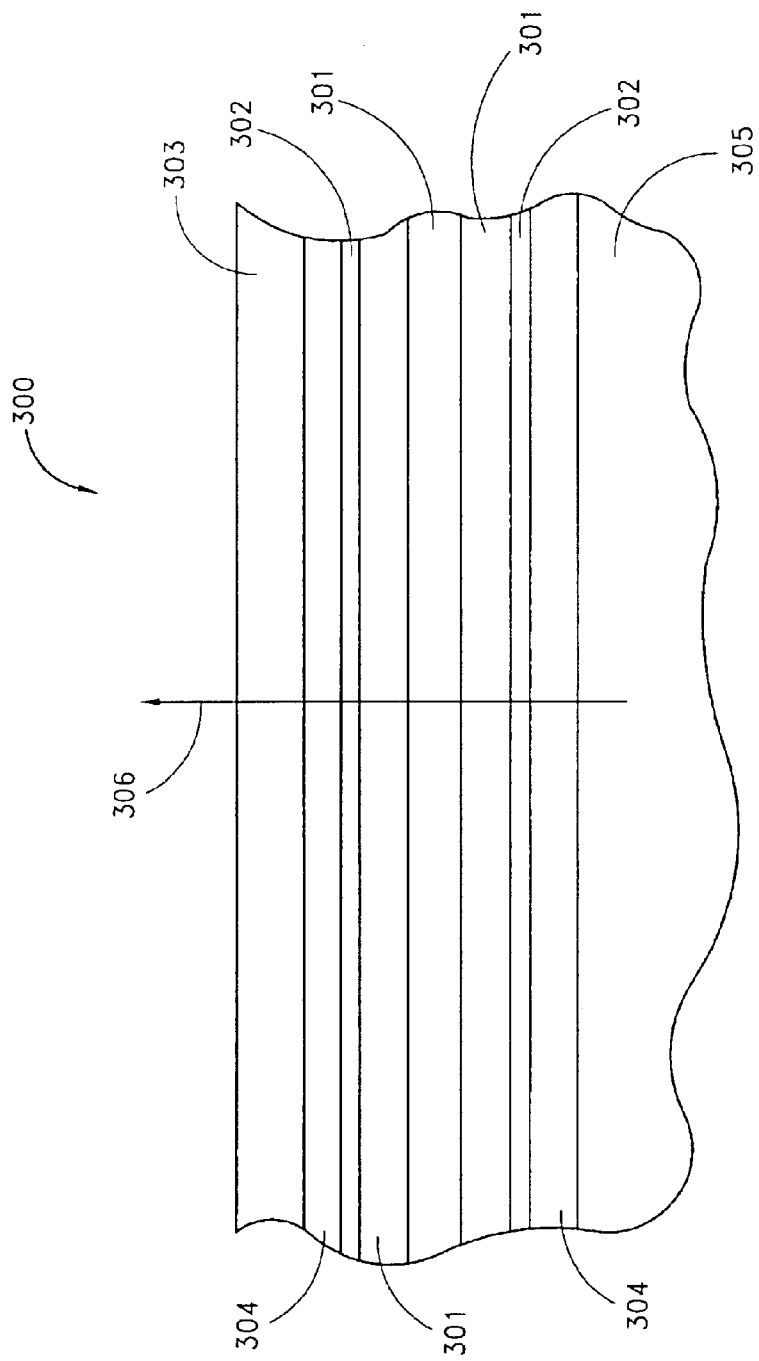
FIG. 3 illustrates a portion of a thermoelectric element.

FIG. 3 depicts a portion of a TE element 300 that has a lower electrode 305, an intermediate conductor material 304, a first diffusion barrier 302 and TE material 301, in plate form. The TE material 301 is depicted as three layers for convenience; in actual TE elements it could be of any number of layers and could have bonding materials (not shown) between the layers as in FIG. 1, to electrically and uniformly connect them. (Alternatively, a material constituent of the heterostructure TE material 301 itself would make the connection if the assembly were suitably processed (such as with heat and pressure). A second diffusion barrier 302 attaches to another intermediate material 304, which attaches to an upper electrode 303. In the example, a current 306 passes from the lower electrode 305 through, the layer and to the upper electrode. Since current passes through the intermediate material 304 and the diffusion barriers 302, advantageously, both are of high electrical and thermal conductivity since the materials are in series with the TE material 301. Thus, the criterion is the same as for the intermediate material 202 of FIG. 2, but the opposite of the bonding material 104 and 206 of FIGS. 1 and 2.

Figure 4:
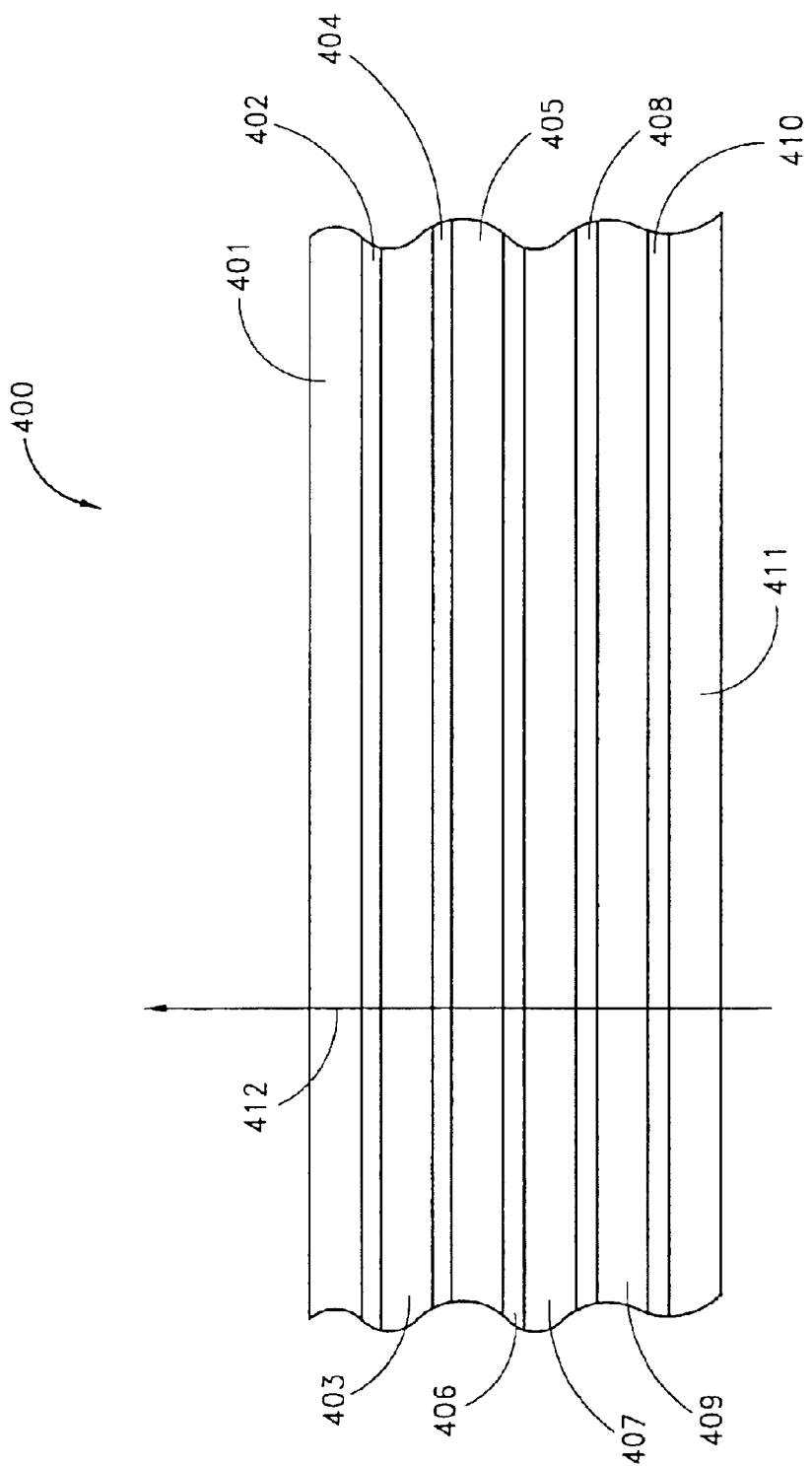
FIG. 4 illustrates a thermoelectric element assembly of heterostructures.

FIG. 4 depicts a portion of a TE element 400. A first portion consists of an upper electrode 401, an intermediate material 402, TE material 403, an intermediate material 404 and a lower electrode 405. The second TE element consists of an upper electrode 407, and intermediate material 408, TE material 409, an intermediate material 410 and a lower electrode 411. Solder 406 or other conductive material is between the lower electrode 405 and the upper electrode 407.

As an example of operation, current 412 passes from the lower electrode 411 through the TE assembly 400 to the upper electrode 401. In this embodiment of the invention, two TE elements both of either N or P conductivity type TE material of the general type of FIG. 3 are connected in series by an intermediate material such as solder 406. This can be done for any of three principal purposes: (1) reduce the power per unit area produced by the assembly; (2) reduce thermal shear stresses; and (3) make the assembly thicker and more rugged. The first purpose is important since costs of fabricating heterostructure TE material increase substantially as the number of layers increases. Furthermore, added layers increase fabrication complexity and reduce yields.

It is important to have the ability to adjust power levels to meet the demands of particular applications. If all else is equal, power density is inversely proportional to TE material thickness. Since heterostructures are most easily made thin, power densities can be over 700 watts/square centimeter which is hundreds of times more than that of typical TE modules fabricated from bulk materials. The high heat fluxes that can result can be difficult to transport without substantial, losses. As a result, TE performance can be reduced so as to partially or completely negate the higher intrinsic TE performance of the heterostructures. By fabricating devices from multiple heterostructures, the TE material is thicker and power density can be reduced. TE performance is reduced by the electrical and thermal resistivity of the intermediate materials, electrodes, solder and other materials in electrical series with the TE material, but such losses are minimized advantageously by careful choice of the materials and how they are mated together. Thermal shear stresses are reduced by making the physical distance between the cold electrode and the hot electrode larger, using multiple layers of the heterostructures, and by choosing materials throughout the assembly that have low coefficients of thermal expansion. Also, stresses can be reduced by utilizing intermediate materials that flex easily, such as conductive rubbers, or materials that contain fluids, conductive greases, mercury, other conductive liquids, and any other material that so that they do not transmit significant shear stresses.

The third purpose of increased thickness is to make the assembly more rugged so that it can withstand subsequent processing, handling, usage and the like. Also, its durability and stability can be increased by cladding and encapsulating or otherwise protecting sensitive constituent materials.

In FIG. 4, the TE materials 403 and 409 may themselves be layers of heterostructure TE materials as in FIGS. 1, 3, 5, and 6.

Figure 5:
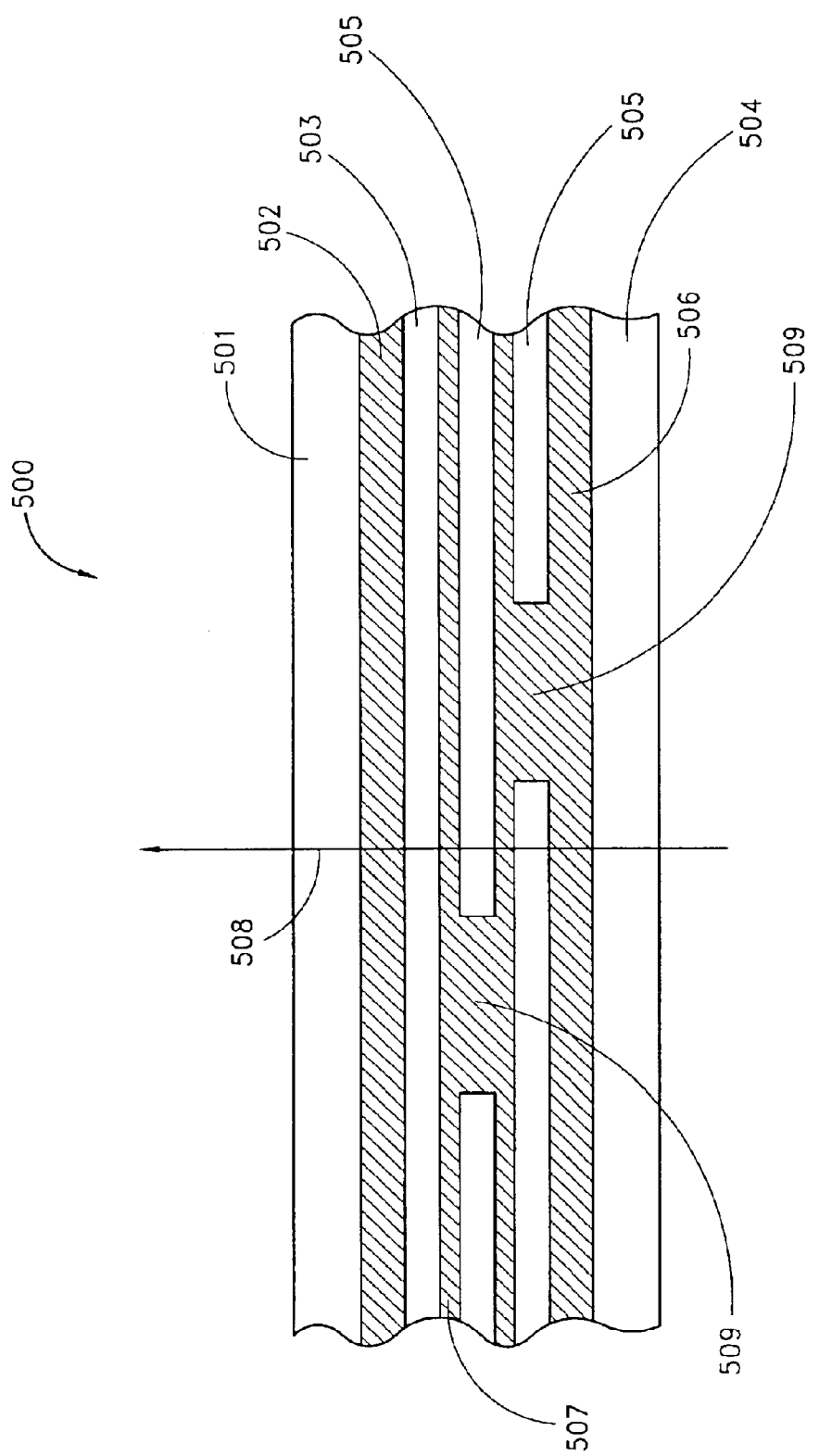
FIG. 5 illustrates a thermoelectric element portion of a heterostructure.

FIG. 5 depicts a TE element portion 500 formed of heterostructure thermoelectric material or thin film layers of thermoelectric material with a first electrode 501, bonding materials 502, 506 and 507, TE plates 503 and 505, and a second electrode 504. The TE plates 505 have gaps 509 due to defects or manufacturing tolerances of the TE plates 503 and 505, joints between the plates, or the assembly of many small TE plates into a larger array or the like. Advantageously, the TE plates 503 and 505 are heterostructures of TE material and the bonding materials 502, 506, 507 generally cover the surfaces of the TE plates 503 and 505, fill the gaps 509 and electrically connect the plates in the direction of current flow 508. The bonding materials 502, 506 and 507 can be made of multiple materials as discussed in the description of FIGS. 2 and 3. In this embodiment, the bonding materials 502, 506 and 507 should have moderate to very high electrical and thermal conductivity. If many gaps 509 exist, electrical conductivity of the bonding materials at 506 and 507 and between the stacked plates 503 and 505 should be moderate. In this case, conductivity should not be so high and bonding material thickness so great that significant current flow 508 is shunted through the gaps 509 in the plates 505 rather than through the TE plates.

Figure 6:
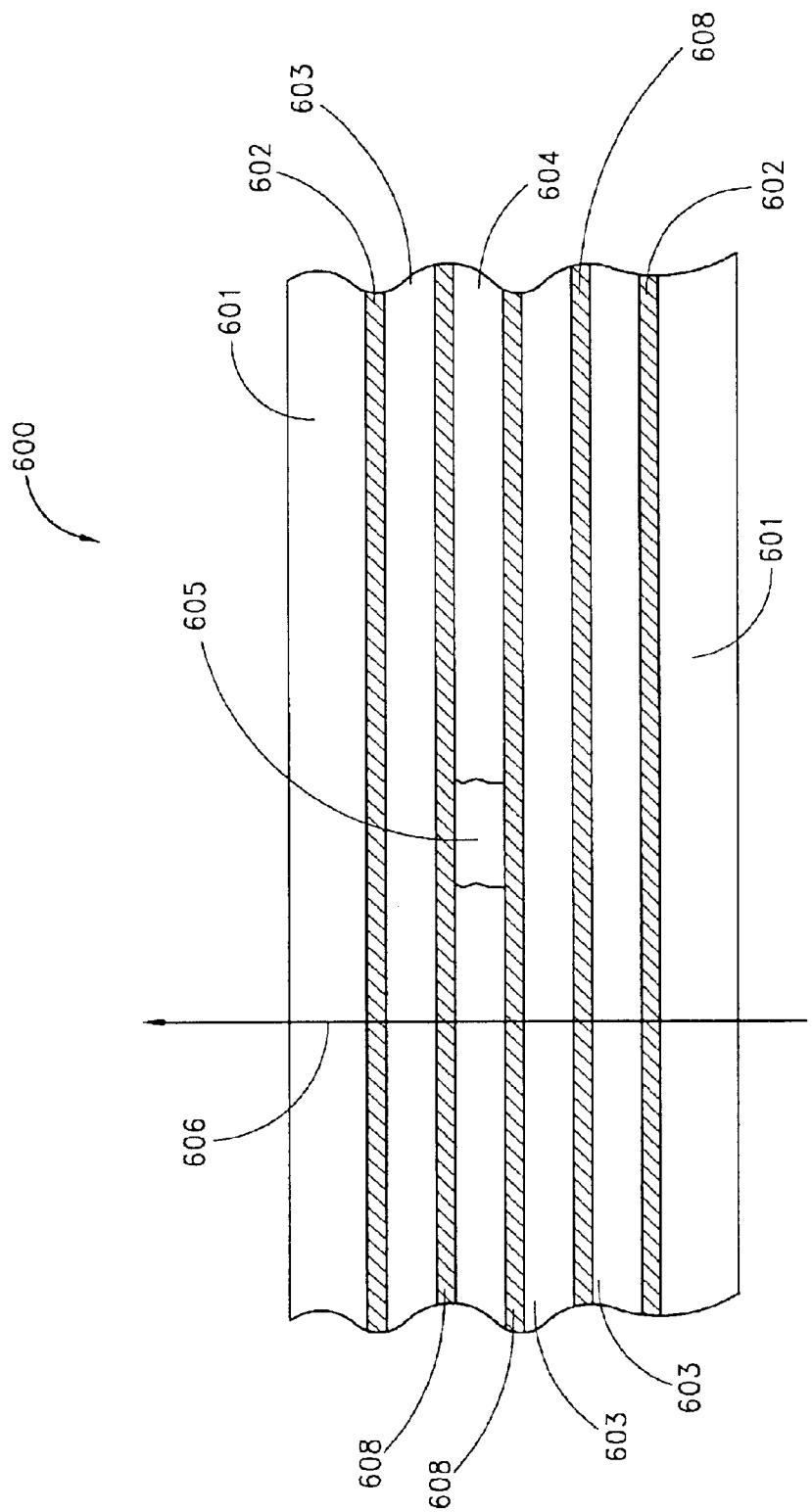
FIG. 6 illustrates a thermoelectric element portion.

FIG. 6 depicts a TE element portion 600 with electrodes 601, intermediate materials 602, TE plates 603 and 604, and gap 605 in a TE plate 604. In addition, bonding materials 608 are depicted between the TE heterostructure layers 603, 604.

As in FIGS. 3, 4 and 5, current 606 passes through the TE element portion 600 generally upward. In this design, two features are presented. First, the TE plates 603 and 604 are fabricated with an outer layer, not shown, that when processed by heat and pressure or other suitable means, causes the plates 603 and 604 to adhere to one another so as to allow current to pass generally uniformly and with very low electrical resistance through the entire TE element 600. Alternately, and as shown in FIG. 6, bonding material 608 can be used to the heterostructure layers 603 and 604. The intermediate materials 602 make similar low electrical and thermal resistance connections to the electrodes 601. Second, if the gaps 605 occur sufficiently infrequently in the TE element 600, no special provisions need be incorporated to enhance current flow in them. Similarly, the intermediate material could be omitted if the bond characteristics between the electrodes 601 and plates 603 are suitable for the conditions discussed related to FIG. 6. Advantageously the TE layers 603, 604 or heterostructure thermoelectric material or thin layers of thermoelectric material.

Figure 7:
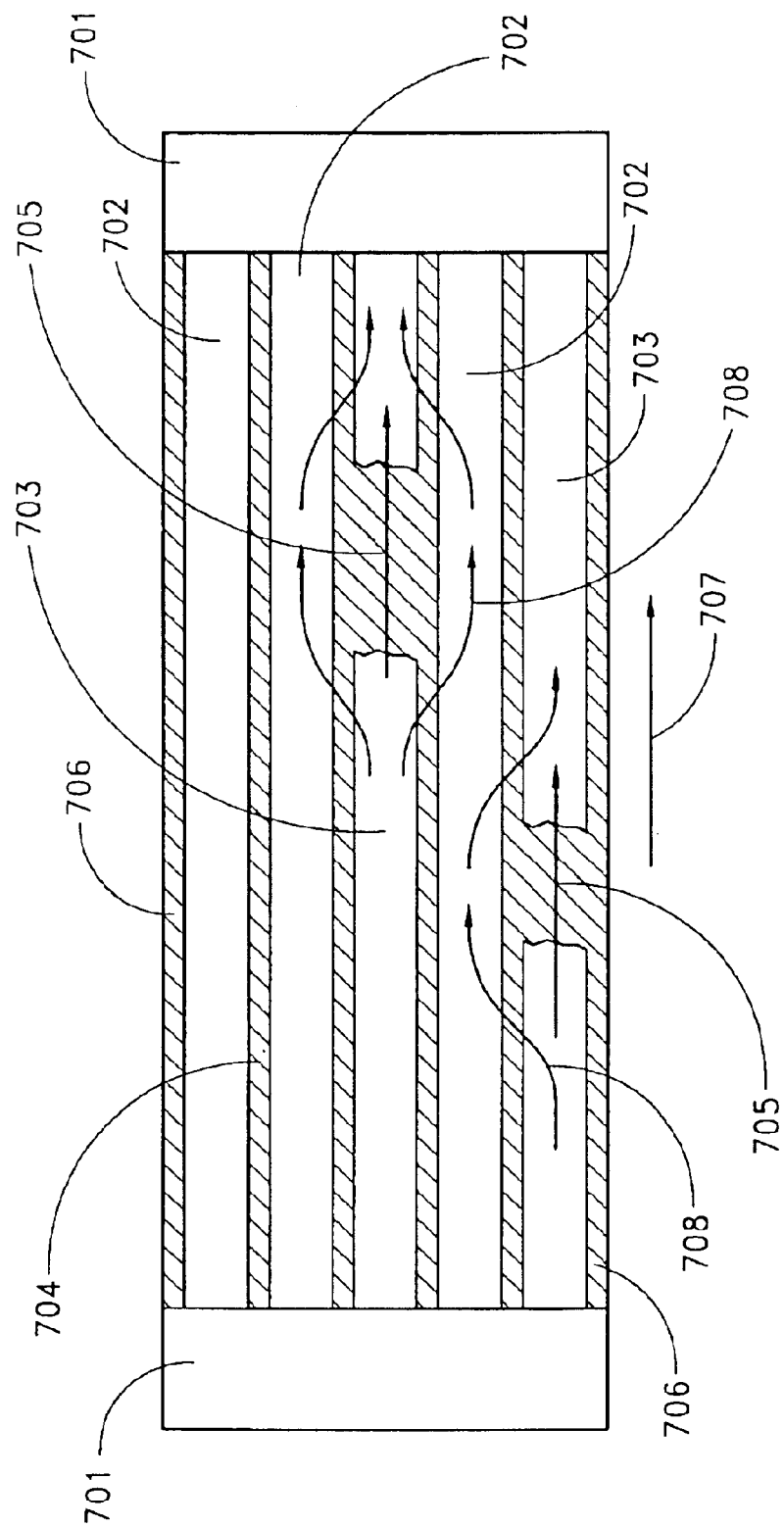
FIG. 7 illustrates another thermoelectric element.

FIG. 7 depicts a TE element 700 with electrodes 701, heterostructure TE plates 702, 703, and bonding materials 704, 706. The current 707 flows generally parallel to a long dimension of the plates 702 and 703. In this configuration, if either a significant number of gaps 705 (or breaks) in the heterostructure plates 703 are present or the number of plates 702 and 703 in the stack is small and some gaps 705 or breaks exist, the current 707 will be diverted by the gaps 705, unless the bonding material 704 and 706 (1) fills the gaps 705, (2) possesses the appropriate degree of electrical conductivity, (3) makes good electrical contact between the gaps 705 and the conductive layers that comprise part of the plates 703, and (4) does not contribute significantly to overall electrical and thermal losses in the TE element. Advantageously, distortion of the current flow 708 can be minimized by utilizing a bonding material 704 with electrical and thermal conductivity somewhat lower than that of the TE plates 702 and 703 in the direction of current flow 707. The bonding materials 706 and 704 need to be thin enough or otherwise configured so that they do not contribute significantly to the TE elements' 601 overall electrical or thermal conductivity and thereby reduce TE efficiency.

If the gaps 705 occur sufficiently infrequently, the bonding material 704 and 706 need not fill the gaps 705, and only need to provide electrical continuity between adjacent plates 702 and 703 so that the current 708 can be accommodated without significant distortion from the infrequent gaps 705 or breaks, as was discussed in the description of FIG. 6.

The TE plates 702, 703 may also be formed of thin layers of thermoelectric material. As mentioned above, the bonding material is also advantageously selected to reduce the shear stresses in the element. For example, flexible or otherwise resilient bonding material may be advantageous in some circumstances.

Table 1 presents a summary of the advantageous characteristics of sleeve, bonding material and intermediate materials. Notwithstanding the guidance presented in Table 1, other considerations or alternative design details may alter the teachings. Thus, Table 1 does not limit the scope of the present invention, but serves instead to give general design guidance.

TABLE 1

| | DIRECTION OF CURRENT FLOW | | | | | | | |
|---|---|---|---|---|---|---|---|---|
| MATERIAL | Parallel | | | | Perpendicular | | | |
| PARAMETER | S | $BM_1$ | $BM_2$ | IM | S | $BM_1$ | $BM_2$ | IM |
| Thermal Conductivity | L | L | L | H | L | H | M | H |
| Electrical Conductivity | L | L | M | H | L | H | M | H |
| Thickness | L | L | L | OPT | L | OPT | L | OPT |

L = Low; M = Medium; H = High; OPT = Optional
S = Sleeve; $BM_1$ = Bonding Material insignificant gaps;
$BM_2$ = Bonding Material significant gaps; IM = Intermediate Material It should be understood that the thickness of the intermediate and bonding materials is generally indicated to meet the desired thermal and electrical characteristics of these layers. As will be understood from the above description, both the thermal conductance and thermal conductivity of these materials is taken into account in selecting the thickness and other properties of these materials.

Although several examples of thermoelectric compositions using the heterostructures and binding concepts described herein, the above-described embodiments are merely illustrative and variations from these could be made. For example, thin layers of TE material could be used rather than heterostructures in any embodiment. Further, features described in any one figure could be combined with features of any other figure, if appropriate, to achieve an advantageous combination in a particular device. Such combinations are also the objects and teachings of the present invention. Accordingly, the invention is defined by the appended claims, wherein the terms used are given their ordinary and accustomed meaning with no particular or special definition attributed to those terms by the specification.

What is claimed is:

1. A thermoelectric element comprising:
   at least two heterostructure thermoelectric portions of the same conductivity type;
   an electrically conductive material coupled to the thermoelectric portions; and
   a bonding material between the at least two heterostructure thermoelectric portions.

2. The thermoelectric element of claim 1, wherein the bonding material is configured to reduce the power density of the thermoelectric.

3. The thermoelectric element of claim 1, wherein the bonding material is configured to reduce shear stress in the layers when the thermoelectric element is operated.

4. A thermoelectric element comprising:
at least two heterostructure thermoelectric portions of the same conductivity type; and
an electrically conductive material coupled to the thermoelectric portions, wherein the heterostructure thermoelectric portions are of substantially the same thermoelectric material.

5. A thermoelectric element comprising:
at least two layers of substantially the same thermoelectric material and of the same conductivity type;
at least one electrically conductive material coupled to the thermoelectric material; and
a bonding material between the at least two layers.

6. The thermoelectric element of claim 5, wherein the bonding material is configured to reduce the power density of the thermoelectric.

7. The thermoelectric element of claim 5, wherein the bonding material is configured to reduce shear stress in the layers when the thermoelectric element is operated.

8. The thermoelectric element of claim 7, further comprising an intermediate material between the at least one electrode and at least one layer of the thermoelectric material.

9. The thermoelectric element of claim 8, wherein the intermediate material is configured to reduce shear stress in the layers when the thermoelectric element is operated.

10. The thermoelectric element of claim 8, wherein the intermediate material is resilient.

11. A method of producing a thermoelectric device comprising the steps of:
forming at least two layers of substantially the same thermoelectric material; and
connecting at least one electrode to at least one of the layers, wherein the step of forming comprises bonding said at least two layers with a bonding material.

12. The method of claim 11, wherein said bonding material is configured to decrease power density.

* * * * *